United States Patent
Hu et al.

(10) Patent No.: US 8,940,641 B1
(45) Date of Patent: Jan. 27, 2015

(54) METHODS FOR FABRICATING INTEGRATED CIRCUITS WITH IMPROVED PATTERNING SCHEMES

(71) Applicant: GLOBALFOUNDRIES, Inc., Grand Cayman (KY)

(72) Inventors: Xiang Hu, Clifton Park, NY (US); Taejoon Han, Clifton Park, NY (US); Hui Peng Koh, Gansevoort, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 14/019,155

(22) Filed: Sep. 5, 2013

(51) Int. Cl.
  *H01L 21/311* (2006.01)
  *H01L 21/308* (2006.01)
(52) U.S. Cl.
  CPC .................... *H01L 21/3086* (2013.01)
  USPC .................... 438/703; 438/700; 438/702
(58) Field of Classification Search
  USPC .................... 438/700–703
  See application file for complete search history.

(56) References Cited

U.S. PATENT DOCUMENTS

| | | | | |
|---|---|---|---|---|
| 6,066,569 A | * | 5/2000 | Tobben | 438/717 |
| 2004/0087139 A1 | * | 5/2004 | Yeh et al. | 438/636 |
| 2005/0090100 A1 | * | 4/2005 | Woo | 438/638 |
| 2010/0327412 A1 | * | 12/2010 | Lee et al. | 257/618 |
| 2011/0039416 A1 | * | 2/2011 | Cole et al. | 438/714 |
| 2014/0097520 A1 | * | 4/2014 | Millward | 257/622 |

* cited by examiner

*Primary Examiner* — Karen Kusumakar
(74) *Attorney, Agent, or Firm* — Ingrassia Fisher & Lorenz, P.C.

(57) ABSTRACT

Methods for fabricating integrated circuits with improved patterning schemes are provided. In an embodiment, a method for fabricating an integrated circuit includes depositing an interlayer dielectric material overlying a semiconductor substrate. Further, the method includes forming a patterned hard mask overlying the interlayer dielectric material. Also, the method forms an organic planarization layer overlying the patterned hard mask and contacting portions of the interlayer dielectric material. The method patterns the organic planarization layer using an extreme ultraviolet (EUV) lithography process. The method also includes etching the interlayer dielectric material using the patterned hard mask and organic planarization layer as a mask to form vias in the interlayer dielectric material.

20 Claims, 4 Drawing Sheets

METHODS FOR FABRICATING INTEGRATED CIRCUITS WITH IMPROVED PATTERNING SCHEMES

TECHNICAL FIELD

The technical field generally relates to lithography, and more particularly relates to methods for fabricating integrated circuits using improved patterning schemes for extreme ultraviolet (EUV) lithography.

BACKGROUND

In conventional fabrication of semiconductor devices, semiconductor wafers are processed in batch, and a large number of complicated devices are formed on a single wafer. With rapid development of very large scale integration (VLSI), wafers are developed toward higher integration density and miniaturization. In the fabrication process, the critical dimensions of integrated circuits are reduced, which raises a higher requirement for lithography processes. However, due to the restriction by the light source wavelength of conventional immersion scanners, conventional lithography cannot meet requirements of processes below 28 nanometers (nm). In order to satisfy the requirements of processes below 28 nm, extreme ultraviolet (EUV) lithography techniques are used. EUV lithography is an emerging technology utilizing extreme ultraviolet light to transfer a circuit layout pattern from a reflective EUV photomask to photoresist overlying a semiconductor substrate.

EUV lithography can be used to form self-aligned vias through interlayer dielectric for the creation of an electrical interconnect structure. Conventionally, photoresist films for exposure by EUV light are formed on an antireflective coating such as a silicon-containing antireflective coating (Si-ARC) that is in turn formed on a planar surface of a material such as a planarization layer. The planarization layer conventionally lies over an etch stop layer formed on the interlayer dielectric. After exposure of the photoresist film and selective etching of the planarization layer to form trenches, the antireflective coating is removed. Further, it may be required that residue from the antireflective coating be removed before further processing of the semiconductor substrate to avoid generating defects on the wafer. Otherwise, the defects generated from the antireflective coating residue may cause yield loss for the fabricated integrated circuit. Also, if it is determined that the etch of the planarization layer is misaligned with underlying objects to be contacted, a rework process may require a wet clean removal of the antireflective coating and a separate strip process to remove the planarization layer before the EUV patterning process is repeated. The Si-Arc removal in a rework process may generate defects on the wafer which would cause yield loss.

Accordingly, it is desirable to provide embodiments of methods for fabricating integrated circuits including improved patterning schemes for use with EUV lithography. It is further desirable to provide embodiments of a method suitable for fabricating an integrated circuit in which the risk of defect generation is minimized and the fabrication is cost effective. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with an exemplary embodiment, a method for fabricating an integrated circuit includes depositing an interlayer dielectric material overlying a semiconductor substrate. Further, the method includes forming a patterned hard mask on the interlayer dielectric material. Also, the method forms an organic planarization layer overlying the patterned hard mask and contacting portions of the interlayer dielectric material. The method patterns the organic planarization layer using an extreme ultraviolet (EUV) lithography process. The method also includes etching the interlayer dielectric material using the patterned hard mask and organic planarization layer as a mask to form vias in the interlayer dielectric material.

In accordance with another embodiment, a method for fabricating an integrated circuit includes patterning a non-ashable hard mask overlying an interlayer dielectric material and objects to be contacted. The method deposits an ashable planarization layer overlying the non-ashable hard mask, and deposits an ashable pattern transfer layer overlying the ashable planarization layer. A photoresist film is patterned overlying the ashable pattern transfer layer. The method further includes etching the ashable pattern transfer layer using the photoresist film as a mask, etching the ashable planarization layer using the ashable pattern transfer layer as a mask to form trenches through the ashable planarization layer, and etching the interlayer dielectric material using the non-ashable hard mask and ashable planarization layer as a mask to form vias in the interlayer dielectric material.

In another embodiment, a method for fabricating an integrated circuit includes depositing an interlayer dielectric material overlying a semiconductor substrate, patterning a hard mask overlying the interlayer dielectric material, depositing a planarization layer overlying the hard mask, depositing a pattern transfer layer overlying the planarization layer, forming a photoresist overlying the pattern transfer layer, and patterning the photoresist. The method determines whether the patterned photoresist is misaligned. If the patterned photoresist is misaligned then the method includes performing a rework process including removing the photoresist, re-forming the photoresist overlying the pattern transfer layer, and re-patterning the photoresist.

BRIEF DESCRIPTION OF THE DRAWINGS

Embodiments of methods for fabricating integrated circuits will be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with improved patterning schemes are provided. With these methods, problems faced by conventional patterning processes when fabricating integrated circuits may be avoided. For example, conventional self-aligned via etch processes utilizing EUV lithography typically require multiple removal steps, including measures to avoid the generation of defects on the wafer due to antireflective coating residue. As provided herein, methods for fabricating integrated circuits avoid use of an antireflective coating material. Accordingly, the methods disclosed herein may avoid use of a capping layer over the interlayer dielectric to protect the interlayer dielectric material from antireflective coating material removal processes. As a result, the methods described herein may form a patterned hard mask and portions of a planarization layer material directly on the interlayer dielectric to be patterned with vias. The methods described herein may provide for a selective reworking process when initial photoresist lithography steps are not properly aligned that involves only the removal, re-deposition and re-patterning of the photoresist rather than removal and re-deposition of underlying layers. Such capability is beneficial as compared to conventional practices wherein underlying layers must be reformed or reworked due to misalignments before self-aligned via etching. Also, embodiments of the methods described herein may provide for the simultaneous removal of photoresist, pattern transfer and planarization layers used in the formation of self-aligned vias by a single removal process, improving processing efficiency.

Figure 7:
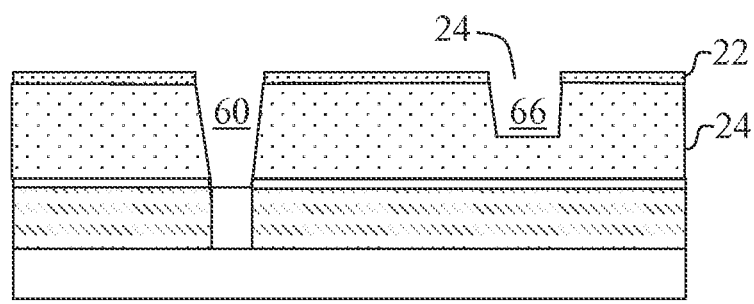
Figure 8:
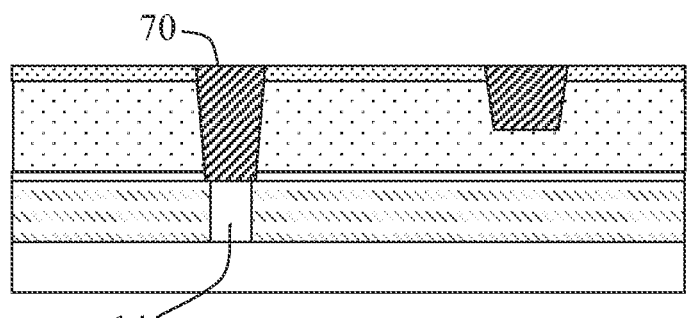
Figure 9:
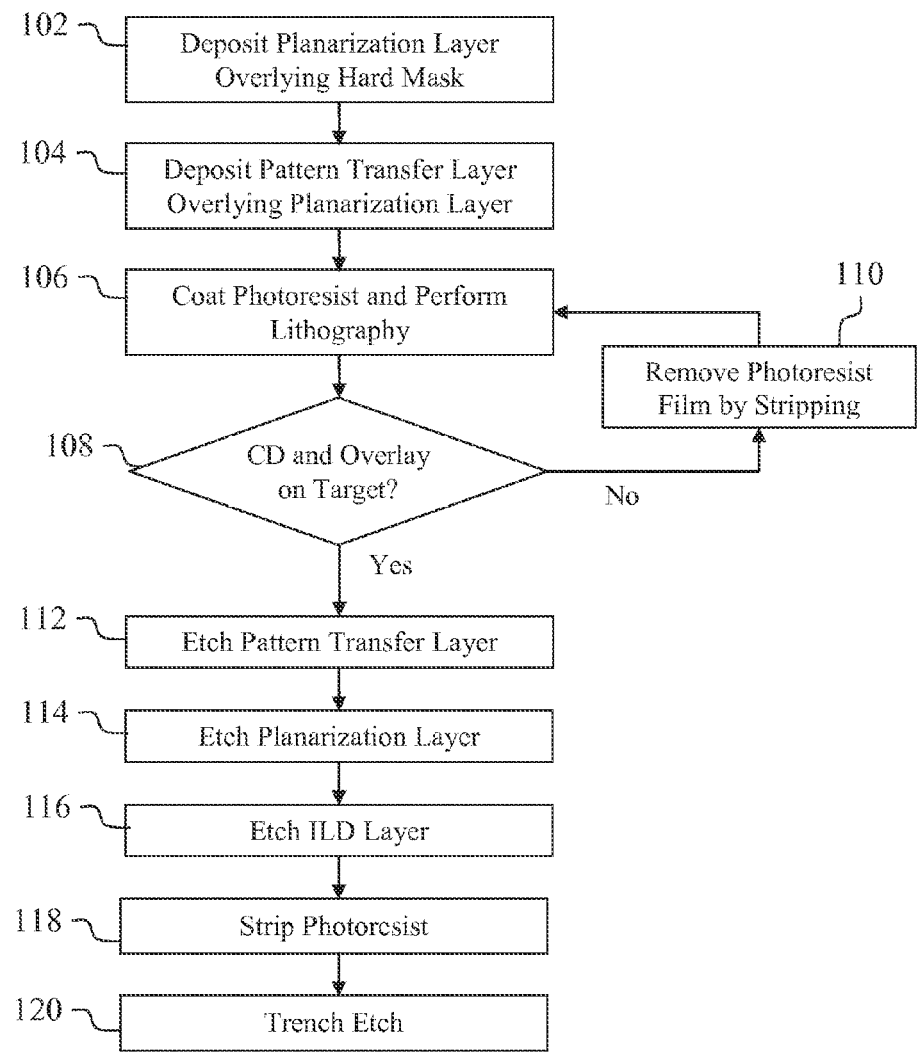
FIG. 9 is a flow chart illustrating steps for fabricating an integrated circuit in accordance with an exemplary embodiment.

FIGS. 1-8 illustrate steps of methods for fabricating integrated circuits in accordance with various embodiments. FIG. 9 provides a flow chart illustrating a method for fabricating integrated circuits and explaining a rework loop. The processes and steps discussed in relation to each illustrated embodiment are applicable to other illustrated embodiments. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
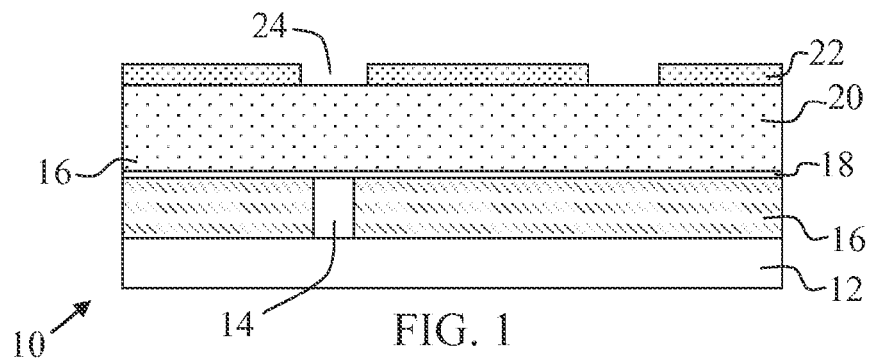
FIGS. 1-8 are cross-sectional views illustrating methods steps for fabricating an integrated circuit in accordance with an exemplary embodiment.

In an exemplary embodiment, FIG. 1 illustrates, in cross-section, steps of a method for fabricating an integrated circuit 10. As shown, the method begins by providing a semiconductor substrate 12, such as a bulk silicon substrate, a silicon-on-insulator substrate, or a substrate of other semiconductor material. A device or contact structure 14, i.e., an object to be contacted, is formed on the semiconductor substrate 12 in accordance with known integrated circuit fabrication processes. An exemplary contact structure 14 is a conductive plug formed in contact with a source/drain region on the semiconductor substrate 12. As shown, the contact structure 14 is surrounded by a dielectric material 16. Further, a dielectric liner 18, such as a low-k dielectric liner, may be formed overlying the contact structure 14 and dielectric material 16.

An interlayer dielectric (ILD) material 20, such as silicon oxide, is blanket deposited overlying the dielectric liner 18. Further, a hard mask material is deposited over the ILD material 20 and is etched to form a patterned hard mask 22. An exemplary hard mask material is titanium nitride and may be formed in any suitable manner, such as by chemical vapor deposition (CVD), physical vapor deposition (PVD), or the like. The hard mask material may be patterned by forming a patterned photoresist mask over the hard mask material, and etching exposed portions of the hard mask material. As shown, the hard mask 22 is formed with openings 24, including an opening 24 overlying the contact structure 14. Other openings 24 may be aligned for formation of trenches for interconnect structures as described below. The exemplary patterned hard mask 22 is formed directly on the ILD material 20, rather than on an intervening layer such as a TEOS layer formed on the ILD material.

Figure 2:
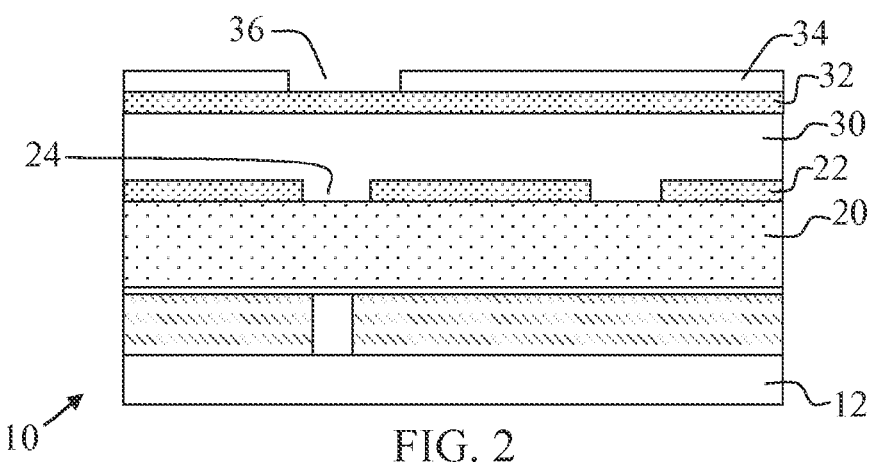

In FIG. 2, a planarization layer 30 is blanket deposited overlying the patterned hard mask 22 and ILD material 20. The so-called "planarization layer" forms a planar upper surface 31 when deposited. The planarization layer 30 may be an organic planarization layer, such as an amorphous carbon layer. In certain embodiments, the planarization layer 30 is ashable. An "ashable" material may be removed by a technique referred to as "ashing," "plasma ashing" or "dry stripping." During such processing, substrates with layers to be ashed, such as semiconductor substrate 12, are placed into a chamber under vacuum, oxygen is introduced, and the substrates are subjected to radio frequency power that creates oxygen radicals (plasma). The radicals react with ashable material to oxidize it to water, carbon monoxide, and carbon dioxide. A "non-ashable" material is not removed by such an ashing process.

A pattern transfer layer 32 is deposited over the planarization layer 30. An exemplary pattern transfer layer 32 is inorganic, and may be silicon nitride or silicon oxide. In certain embodiments, the pattern transfer layer 32 is low temperature oxide, commonly referred to as LTO and formed by CVD using tetraethylorthosilicate (TEOS) between about 650° C. and about 750° C. Further, an exemplary pattern transfer layer 32 is ashable. As further shown, a patterned photoresist film 34 is formed over the pattern transfer layer 32. For example, a photoresist film is deposited overlying the pattern transfer layer 32 and is patterned by exposure to EUV light reflected from a EUV mask to form the patterned photoresist film 34 with an opening 36. After patterning the photoresist film 34, it is determined if the photoresist film is properly aligned. Specifically, it is determined if the opening 36 has an appropriate critical dimension (CD) and if it lies over the opening 24 in the hard mask 22 and, accordingly, the contact structure 14. If the opening 36 is not properly aligned with the opening 24 and contact structure 14, then the photoresist film 34 is removed and a new photoresist film 34 is deposited, patterned, and checked for alignment with the opening 24 and contact structure 14

Figure 3:
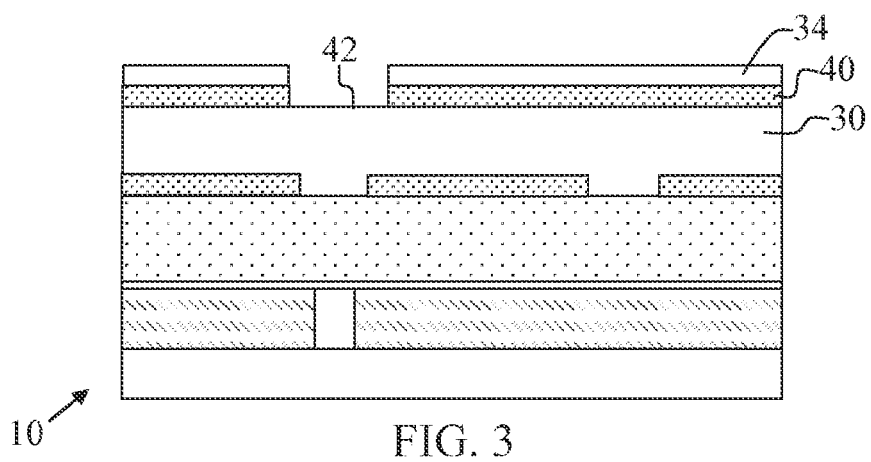

After the photoresist film 34 is determined to be in proper alignment, the process continues with the etching of the pattern transfer layer 32 to form a patterned or etched pattern transfer layer 40 in FIG. 3. Specifically, the pattern transfer layer 32 is etched with an anisotropic etchant while using the patterned photoresist film 34 as a mask. As shown, portions 42 of the planarization layer 30 are exposed by the pattern transfer layer 40.

Figure 4:
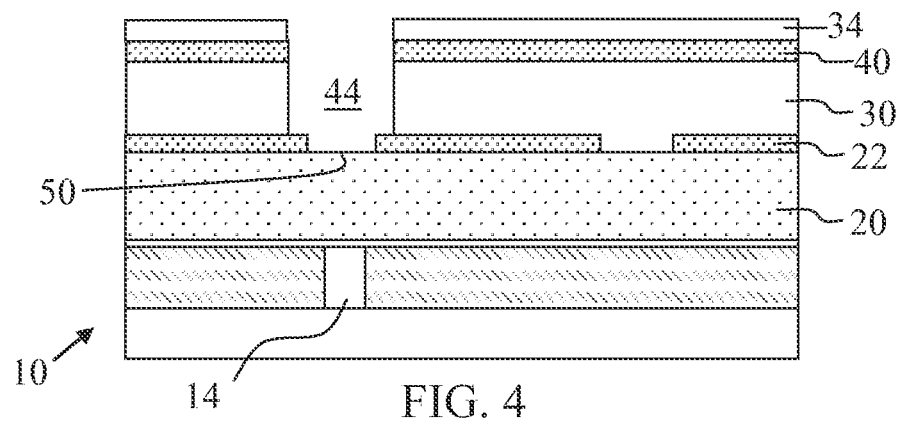
Figure 5:
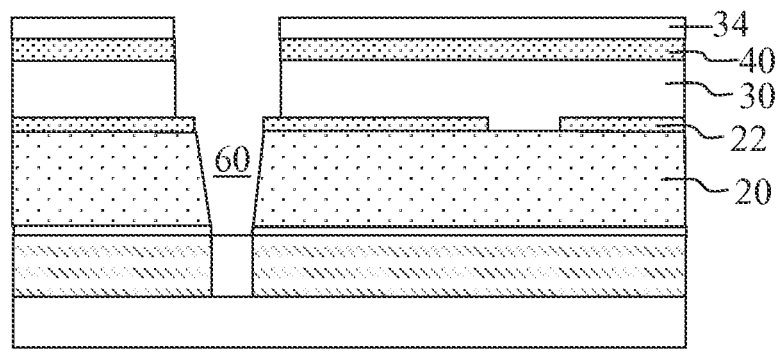

In FIG. 4, an anisotropic etch, such as a reactive ion etch (RIE), is performed on the planarization layer 30 using the pattern photoresist film 34 and the pattern transfer layer 40 as an etch mask to form a trench 44 through the planarization layer 30. As shown, the trench 44 is aligned so that it fully lands on the ILD material 20 and partially on the hard mask 22. As a result, an exposed portion 50 of the ILD material 20 is formed with a width smaller than the patterned opening in the pattern transfer layer 40.

Because the patterned photoresist film 34 is aligned with the contact structure 14 before etching of underlying layers are commenced, the trench 44 and exposed portion 50 of the ILD material 20 are aligned with the contact structure 14 so that a self-aligned via process properly exposes the contact structure 14. A self-aligned via etch process is performed to etch the exposed portion 50 of the ILD material 20 and form a self-aligned via 60 in the ILD material 20. The self-aligned via etch process uses the hard mask 22 and the planarization layer 30 as masks. An exemplary self-aligned via etch process is an anisotropic RIE process.

Figure 6:
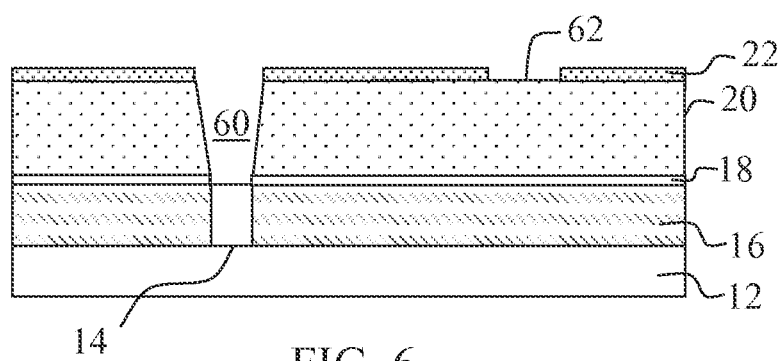

In FIG. 6, the photoresist film 34, pattern transfer layer 40, and planarization layer 30 may be removed after the self-aligned via etch process. The removal of the photoresist film 34, pattern transfer layer 40, and planarization layer 30 may be performed with a single process, such as an ashing process. Such a process does not remove the hard mask 22 or underlying layers. As a result of the single process removal of the photoresist film 34, pattern transfer layer 40, and planarization layer 30, fabrication method steps are minimized. The resulting structure of the partially fabricated integrated circuit 10 is shown in FIG. 6 and includes the hard mask 22, ILD material 20, the dielectric liner 18, the dielectric material 16, self-aligned via 60, the contact structure 14, and the semiconductor substrate 12. The self-aligned via 60 is in alignment with the contact structure 14. As shown, the hard mask 22 exposes a non-etched portion 62 of the ILD material 20.

In FIG. 7, a trench etch process is performed to form a trench 66 in the ILD material 20. As shown, the non-etched portion 62 of the ILD material 20 lying under opening 24 in the hard mask 22 is etched to form the trench 66. In FIG. 8, a conductor 70, such as tungsten or other suitable material, is then deposited in the self-aligned via 60 and trench 66 in accordance with conventional processing to form electrical contacts to the contact structure 14 and to form interconnect structures.

FIG. 9 provides a flow chart for the method described in FIGS. 1-8. As shown, the exemplary method 100 begins after patterning the hard mask 22 over the ILD material 20 with the step 102 of depositing the planarization layer 30 overlying the patterned hard mask 22. Then, a pattern transfer layer 32 is deposited overlying the planarization layer 30 in step 104. In step 106, a photoresist film 34 is coated onto the pattern transfer layer 32 and is patterned with a photolithography process. After step 106, the partially completed integrated circuit 10 has the structure shown in FIG. 2.

In step 108, it is determined if the critical dimension (CD) of the patterned photoresist film 34 is proper and if the opening(s) formed in the patterned photoresist film 34 are on target, i.e., aligned with the contact structure 14. If no, step 110 removes the photoresist film 34 by stripping, and the process repeats step 106. If the patterned photoresist film 34 has an appropriate CD and is on target with the contact structure 14, then the process continues with step 112 where the pattern transfer layer 32 is etched, using the photoresist film 34 as a mask to form a patterned or etched pattern transfer layer 40. The structure of the partially completed integrated circuit 10 at this stage is shown in FIG. 3.

The process continues with etching the planarization layer 30 using the pattern transfer layer 40 as a mask in step 114. After this step, the partially completed integrated circuit 10 has the structure shown in FIG. 4. At step 116, the ILD material 20 is etched in accordance with the processes described in relation to FIG. 5. Then, the photoresist film 34 is stripped in step 118. In an exemplary embodiment, the patterned photoresist film 34, the pattern transfer layer 40, and the planarization layer 30 are simultaneously ashed by a process for which the hard mask 22 and underlying layers are not ashed. Thus, the ashing process can be performed to simultaneously remove the patterned photoresist film 34, the pattern transfer layer 40, and the planarization layer 30 while leaving the hard mask 22 and underlying layers intact for trench formation. In step 120, a trench etch is performed, resulting in the structure of the partially completed integrated circuit 10 shown in FIG. 7. Thereafter, metal deposition is performed to complete contact and interconnect structures as shown in FIG. 8.

Accordingly, methods for fabricating integrated circuits with improved patterning schemes have been described. Such methods described herein provide for more efficient processing. For example, embodiments herein provide for efficient reworking to attain proper alignment by only requiring removal of the photoresist film, re-deposition of the photoresist film, and re-patterning of the photoresist film, rather than reworking the underlying layers. Embodiments herein avoid use of an antireflective coating and of multiple removal processes used in conventional processing.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application

What is claimed is:

1. A method for fabricating an integrated circuit, the method comprising:
   depositing an interlayer dielectric material overlying a semiconductor substrate;
   forming a patterned hard mask overlying the interlayer dielectric material;
   forming an organic planarization layer overlying the patterned hard mask and contacting portions of the interlayer dielectric material;
   patterning the organic planarization layer using an extreme ultraviolet (EUV) lithography process; and
   etching the interlayer dielectric material using the patterned hard mask and organic planarization layer as a mask to form vias in the interlayer dielectric material.

2. The method of claim 1 wherein patterning the organic planarization layer using an extreme ultraviolet (EUV) lithography process comprises:
   depositing low-temperature oxide (LTO) forming a pattern transfer layer on the organic planarization layer;
   depositing a photoresist film on the pattern transfer layer;
   exposing the photoresist film to EUV light and developing the photoresist film; and
   etching the pattern transfer layer using the photoresist film as a mask.

3. The method of claim 1 wherein patterning the organic planarization layer using an extreme ultraviolet (EUV) lithography process comprises:
   depositing a pattern transfer layer overlying the organic planarization layer;
   patterning the pattern transfer layer; and
   etching the organic planarization layer using the pattern transfer layer as a mask to form trenches through the organic planarization layer, wherein the trenches land at least partially on the interlayer dielectric material.

4. The method of claim 3 wherein:
   depositing a pattern transfer layer overlying the organic planarization layer comprises depositing silicon oxide or silicon nitride forming the pattern transfer layer overlying the organic planarization layer; and patterning the pattern transfer layer comprises:
depositing an EUV photoresist film overlying the pattern transfer layer;
exposing and developing the EUV photoresist film with a selected pattern; and
etching the pattern transfer layer while using the EUV photoresist film as a mask.

5. The method of claim 3 wherein depositing a pattern transfer layer overlying the organic planarization layer comprises depositing low-temperature oxide (LTO) forming the pattern transfer layer overlying the organic planarization layer; and wherein patterning the pattern transfer layer comprises:
forming a patterned EUV photoresist film overlying the pattern transfer layer; and
etching the pattern transfer layer while using the patterned EUV photoresist film as a mask.

6. The method of claim 5 further comprising:
removing the patterned EUV photoresist film, the pattern transfer layer, and the organic planarization layer after etching the interlayer dielectric material to form vias in the interlayer dielectric material; and
etching the interlayer dielectric material using the patterned hard mask as a mask to form trenches.

7. The method of claim 2 wherein forming a patterned hard mask overlying the interlayer dielectric material comprises:
depositing a hard mask material on the interlayer dielectric material; and
selectively etching the hard mask material to form the patterned hard mask.

8. A method for fabricating an integrated circuit, the method comprising:
patterning a non-ashable hard mask overlying an interlayer dielectric material and objects to be contacted;
depositing an ashable planarization layer overlying the non-ashable hard mask;
depositing an ashable pattern transfer layer overlying the ashable planarization layer;
patterning a photoresist film overlying the ashable pattern transfer layer;
etching the ashable pattern transfer layer using the photoresist film as a mask;
etching the ashable planarization layer using the ashable pattern transfer layer as a mask to form trenches through the ashable planarization layer; and
etching the interlayer dielectric material using the non-ashable hard mask and ashable planarization layer as a mask to form vias in the interlayer dielectric material.

9. The method of claim 8 wherein the photoresist film, the ashable pattern transfer layer and the ashable planarization layer comprise ashable layers, the method further comprising removing the ashable layers with a single ashing process after forming vias in the interlayer dielectric material.

10. The method of claim 9 further comprising etching the interlayer dielectric material using the non-ashable hard mask as a mask to form trenches in the interlayer dielectric material.

11. The method of claim 10 further comprising depositing conductive material in the vias and in contact with the objects to be contacted and in the trenches.

12. The method of claim 8 wherein patterning a non-ashable hard mask overlying the interlayer dielectric material comprises depositing the non-ashable hard mask directly on the interlayer dielectric material.

13. The method of claim 8 wherein etching the ashable planarization layer using the ashable pattern transfer layer as a mask to form trenches through the ashable planarization layer comprises landing the trenches on the interlayer dielectric material.

14. The method of claim 8 wherein patterning a photoresist film overlying the ashable pattern transfer layer comprises:
depositing an extreme ultraviolet (EUV) photoresist film overlying the ashable pattern transfer layer; and
selectively exposing and developing the EUV photoresist film.

15. The method of claim 8 wherein depositing an ashable pattern transfer layer overlying the ashable planarization layer comprises depositing low-temperature oxide (LTO) forming the ashable pattern transfer layer overlying the ashable planarization layer.

16. The method of claim 8 further comprising:
determining if the photoresist film is patterned correctly, and if the photoresist film is not patterned correctly:
removing the photoresist film;
re-depositing a photoresist film; and
re-patterning the re-deposited photoresist film.

17. A method for fabricating an integrated circuit, the method comprising:
depositing an interlayer dielectric material overlying a semiconductor substrate;
patterning a hard mask overlying the interlayer dielectric material;
depositing a planarization layer overlying the hard mask;
depositing a pattern transfer layer overlying the planarization layer;
forming a photoresist overlying the pattern transfer layer;
patterning the photoresist;
determining whether the patterned photoresist is misaligned; and if the patterned photoresist is misaligned then performing a rework process comprising:
removing the photoresist;
re-forming the photoresist overlying the pattern transfer layer; and
re-patterning the photoresist.

18. The method of claim 17 further comprising, if the patterned photoresist is not misaligned:
etching the pattern transfer layer using an extreme ultraviolet (EUV) lithography process with the patterned photoresist as a mask;
etching the planarization layer using the pattern transfer layer as a mask; and
etching the interlayer dielectric material using the pattern transfer layer and the planarization layer as a mask.

19. The method of claim 18 wherein the method further comprises:
removing the photoresist, the pattern transfer layer, and the planarization layer in a single removal process; and
etching the interlayer dielectric material further using the hard mask as a mask to form trenches in the interlayer dielectric material.

20. The method of claim 17 wherein patterning a hard mask overlying the interlayer dielectric material comprises depositing the hard mask directly on the interlayer dielectric material.

* * * * *